United States Patent [19]

Miyata et al.

[11] Patent Number: 5,371,383

[45] Date of Patent: Dec. 6, 1994

[54] HIGHLY ORIENTED DIAMOND FILM FIELD-EFFECT TRANSISTOR

[75] Inventors: Koichi Miyata; Kimitsugu Saito, both of Kobe, Japan; David L. Dreifus, Cary; Brian R. Stoner, Raleigh, both of N.C.

[73] Assignee: Kobe Steel USA Inc., Research Triangle Park, N.C.

[21] Appl. No.: 62,052

[22] Filed: May 14, 1993

[51] Int. Cl.$^5$ ............... H01L 31/0312; H01L 29/12; H01L 29/04; H01L 31/036
[52] U.S. Cl. .................... 257/77; 257/613; 257/627; 437/100; 117/929; 427/249; 428/408; 156/643
[58] Field of Search ............... 257/77, 613, 485, 627, 257/712; 437/100, 22, 103; 117/929; 427/249; 428/408; 156/643; 338/22 SD, 22 R

[56] References Cited

U.S. PATENT DOCUMENTS

| | | | |
|---|---|---|---|
| 4,670,968 | 6/1987 | Mikami et al. | 437/22 |
| 4,806,900 | 2/1989 | Fujimori et al. | 338/22 R |
| 5,066,938 | 11/1991 | Kobashi et al. | 338/22 SD |
| 5,086,014 | 2/1992 | Miyata et al. | 437/103 |
| 5,089,802 | 2/1992 | Yamazaki | 338/22 SD |
| 5,124,179 | 6/1992 | Garg et al. | 427/249 |
| 5,126,206 | 6/1992 | Garg et al. | 428/408 |
| 5,183,530 | 2/1993 | Yamazaki | 156/643 |

FOREIGN PATENT DOCUMENTS

| | | | |
|---|---|---|---|
| 0421397 | 4/1991 | European Pat. Off. | 257/77 |
| 445998A1 | 9/1991 | European Pat. Off. | 257/77 |
| 59-137396 | 8/1984 | Japan | 257/77 |
| 60-12747 | 1/1985 | Japan | 257/712 |
| 61-251158 | 11/1986 | Japan | 257/712 |
| 6455862 | 3/1989 | Japan | 257/77 |
| 6468966 | 3/1989 | Japan | 25/77 |
| 1158774 | 6/1989 | Japan | 257/77 |
| 2273960 | 11/1990 | Japan | 257/712 |
| 312966 | 1/1991 | Japan | 257/77 |
| 394429 | 4/1991 | Japan | 257/77 |
| 3-110866 | 5/1991 | Japan | 257/77 |
| 3120865 | 5/1991 | Japan | 257/77 |
| 3160731 | 7/1991 | Japan | 257/77 |
| 3263872 | 11/1991 | Japan | 257/77 |
| 3278463 | 12/1991 | Japan | 257/77 |
| 3278474 | 12/1991 | Japan | 257/77 |
| 426161 | 1/1992 | Japan | 257/77 |
| 426172 | 1/1992 | Japan | 257/77 |
| 2243949 | 11/1991 | United Kingdom | 257/77 |
| 2252202A | 7/1992 | United Kingdom | 257/77 |

OTHER PUBLICATIONS

Patent Abstracts of Japan, Patent No. 04-240190, Aug. 27, 1992, Taki, by Automatic Patent Search.
Geis, *Growth of textured diamond films on foreign substrates from attached seed crystals,* Appl. Phys. Lett., 55:550-552 (1989).
U.S. Patent Application Serial No. 07/811,425, filed Dec. 20, 1991, *Nucleation Enhancement for Chemical Vapor Deposition of Diamond,* Stoner et al., now abandoned.
U.S. Patent Application Serial No. 07/937,481, filed Aug. 28, 1992, *Nucleation Enhancement for Chemical Vapor Deposition of Diamond,* Stoner et al., allowed Mar. 28, 1994.
U.S. Patent Application Serial No. 08/035,643, filed Mar. 23, 1993, *Microelectronic Structure Having an Array of Diamond Structures on a Nondiamond Substrate and Associated Fabrication Methods,* Dreifus et al., pending.

*Primary Examiner*—Steven Ho Yin Loke
*Attorney, Agent, or Firm*—Bell Seltzer Park & Gibson

[57] ABSTRACT

A diamond film FET according to the present invention comprises a semiconducting diamond layer, a gate, a source, and a drain, wherein said semiconducting diamond layer comprises a semiconducting highly-oriented diamond film grown by chemical vapor deposition, and at least 80% of the surface area of said diamond film consists of either (100) or (111) crystal planes, and the differences $\{\Delta\alpha, \Delta\beta, \Delta\gamma\}$ of Euler angles $\{\alpha, \beta, \gamma\}$, which represent the orientations of either (100) or (111) crystal planes, simultaneously satisfy the following relations between the adjacent crystal planes: $|\Delta\alpha| \leq 5°$, $|\Delta\beta| \leq 5°$ and $|\Delta\gamma| \leq 5°$.

16 Claims, 4 Drawing Sheets

SURFACE STRUCTURE OF DIAMOND FILM
WITH HIGHLY ORIENTED (100) CRYSTAL PLANE

STANDARD ORIENTATION OF
CRYSTAL PLANE

SURFACE STRUCTURE OF DIAMOND FILM
WITH HIGHLY ORIENTED (100) CRYSTAL PLANE

HIGHLY ORIENTED DIAMOND FILM FIELD-EFFECT TRANSISTOR

BACKGROUND OF THE INVENTION

1. Field of the Invention

The present invention relates to a diamond film field-effect transistor (hereinafter referred to as FET) wherein a semiconducting layer functioning as a channel layer is formed of a highly-oriented diamond film.

2. Prior Art

Diamond has a large band gap (5.5 eV), high thermal conductivity (20 W.K/cm), high saturation carrier mobility (2000 cm$^2$/V.sec for electrons and 2100 cm$^2$/V.sec for holes) and a high dielectric breakdown voltage (10$^7$V/cm).

Since it is possible to make a semiconducting diamond by adding appropriate impurities to diamond, diamond has drawn attention for application to various fields, such as electronic devices operating under high temperature and radiation, and high power and high frequencies.

There are many proposals for the structure of field-effect transistors (FETs) using diamond films (Japanese under Provisional Publication sho 64-68966, and hei 1-158774, 3-94429, 3-12966, 3-160731, and 3-263872).

Diamond film FETs disclosed by these prior art references are all fabricated by either single crystal diamond substrates, homoepitaxial diamond films grown on single crystal diamond substrates or polycrystalline diamond films as constituents.

Single crystal diamond has a disadvantage for practical use because the integration of device elements is impossible due to its small surface area (several mm$^2$). Further, single crystal diamonds are expensive and therefore the manufacturing cost becomes very high. In addition, there exist crystal defects in natural and synthesized single crystal diamonds and therefore the electrical characteristics have not yet reached the level of theoretical characteristics for single crystal diamond.

Recent advancement of diamond film deposition technology has made it possible to grow a uniform polycrystalline diamond film on a non-diamond substrate over 4 inch wafer and at low cost. Therefore, production of FETS using poly-crystalline diamond films can lead to high integration of diamond film FETs. However, currently produced polycrystalline diamond films contain many grain boundaries and the surface of the film is very rough.

The grain boundaries cause carrier scatterings which results in a significant reduction in the hole mobility, and can cause current leakage. If the polycrystalline diamond film is under high temperature in air, is oxidized and graphitized along the grain boundaries. The crystal defects also cause carrier scatterings which also results in a decrease of carrier mobility. The roughness of the film surface causes a heterogeneity in the electric field in electronic devices.

Therefore, although, polycrystalline diamond films have an advantage for device production due to its large area, the characteristic of the fabricated devices are far behind the commercially acceptable level.

SUMMARY OF THE INVENTION

It is an object of the present invention to provide a diamond film FET with excellent electrical characteristics, and which can be mass produced at low cost.

A diamond film FET according to the present invention comprises a gate, a source, a drain and a semiconducting channel layer. The semiconducting channel layer is a highly-oriented diamond film grown by chemical vapor deposition (CVD) and at least 80% of the surface area of the diamond film consists of either (100) or (111) crystal planes, and the differences $\{\Delta\alpha, \Delta\beta, \Delta\gamma\}$ of Eulerian angles $\{\alpha, \beta, \gamma\}$, indicating the orientations of the crystal planes, simultaneously satisfy $|\Delta\alpha| \leq 5°$, $|\Delta\beta| \leq 5°$ and $|\Delta\gamma| \leq 5°$ between the adjacent crystal planes.

FIGS. 1A and 1B show diagrammatically the surface structure of the diamond film of the invention wherein the (100) crystal planes are highly oriented. The x and y-axes cross at right angles to each other in the film surface, and the z-axis is along the film surface normal. The Eulerian angles indicating the orientations of the crystal planes of the (i)th diamond crystal and the adjacent (j)th diamond crystal are denoted as $\{\alpha_i, \beta_i, \gamma_i\}$ and $\{\alpha_j, \beta_j, \gamma_j\}$, respectively, and the angle differences between the two are expressed as $\{\Delta\alpha, \Delta\beta, \Delta\gamma\}$.

The Eulerian angles $\{\alpha, \beta, \gamma\}$ indicate the orientation of the crystal plane that can be attained by rotating the standard crystal plane around the standard coordinates of axes z, y and z by the angles $\alpha$, $\beta$ and $\gamma$ one after another.

According to this invention, the highly-oriented diamond film satisfies $|\Delta\alpha| \leq 5°$, $|\Delta\beta| \leq 5°$ and $|\Delta\gamma| \leq 5°$ simultaneously. It therefore follows that the crystals are oriented to a high degree and that the carrier mobilities are as high as those in homoepitaxial diamond films.

For the case of crystals with the (111) crystal planes, the crystals are highly oriented as well and the carrier mobility becomes high when all the absolute values of the differences in Eulerian angles are below 5°. Such a highly-oriented diamond film can be formed, for instance, by subjecting a mirror-finished silicon substrate to microwave radiation while applying a negative bias in the gas phase containing methane.

Also, since the misorientation between adjacent crystal planes is within ±5° in the highly-oriented diamond film used in the present invention, the orientational differences between adjacent planes become smaller for a longer CVD period, and therefore the effect of grain boundaries also becomes smaller than that of prior art polycrystalline diamond films. Since the diamond film is deposited by CVD, the diamond film according to the present invention contains less impurities and has a lower defect density compared to natural and synthetic diamonds. For these reasons, the hole mobility of the diamond film according to the present invention is higher than the reported values for polycrystalline diamond films and single crystal diamonds. In addition, oxidation and graphitization of diamond are less likely to occur in the highly-oriented diamond film according to the present invention because of low grain boundary density. Therefore, stable and prolonged operation of the diamond field-effect transistor can be achieved at high temperature. Since the diamond film of the present invention has an ordered surface structure, a uniform electric field vertical to the film surface can be applied.

In addition, since an inexpensive commercial silicon wafer can be used as the substrate for diamond deposition, and a highly-oriented diamond film can be formed on a large wafer, mass production and cost reduction of the diamond film FETs can be achieved.

A diamond film FET according to the invention in which the gate electrode is directly formed on the semiconducting channel layer can be used as a high frequency field-effect transistor.

A diamond film FET according to the invention in which a diamond insulating layer is formed between the semiconducting channel layer and the gate electrode can be used as a high voltage and high current transistor.

A diamond film FET according to the invention in which a non-diamond insulating layer is formed between the semiconducting channel layer and the gate electrode can be used both for depletion-type and enhancement-type transistors.

A FET according to invention, in which a double layer of non-diamond insulating layer and an insulating diamond film is formed by CVD between the semiconducting channel layer and the gate electrode, can be used especially at high temperatures.

It is possible to reduce the contact resistance at the source and drain electrodes in order to improve FET characteristics according to another aspect of the invention by forming the semiconducting diamond layers, which have a lower resistance than that of the semiconducting channel layer, directly below the source and drain electrodes by ion implantation or CVD. Any materials capable of forming an ohmic junction with diamond can be used as the source and drain electrodes.

The gate electrode may be formed of any metals which can be vapor-deposited. Also, low resistant diamond films, low resistance silicon films, low resistant silicon carbide films or low resistance boron nitride films or the like may be used.

The heat resistance of the FET can be improved by coating the FET with a protective layer formed of any material selected from the group consisting of insulting diamond, silicon oxide, silicon nitride, aluminum oxide and aluminum nitride or a multi-layer thereof.

If a patterning of the diamond film is necessary during the FET manufacturing process, it can be achieved by a selective deposition technique, plasma etching or ion beam etching.

The diamond film FET according to the present invention is chemically stable and resistant to radiation. Therefore, it can be used under harsh environmental conditions.

The present invention provides the possibility of mass-production of FETs on a large surface unlike the prior art. Therefore, monolithic integrated circuits of diamond film FETs and hybrid integrated circuits involving diamond FETs, as well as silicon and GaAs devices can be manufactured.

BRIEF DESCRIPTION OF DRAWINGS

FIG. 1A shows the standard orientation of crystalline plane, while FIG. 1B shows the surface structure of the diamond film in which the (100) planes are highly oriented;

DETAILED DESCRIPTION OF THE PREFERRED EMBODIMENTS

First, a manufacturing process of a diamond film FET of the example will be explained using FIGS. 2A to 2D.

(Step 1)

Figure 1A:
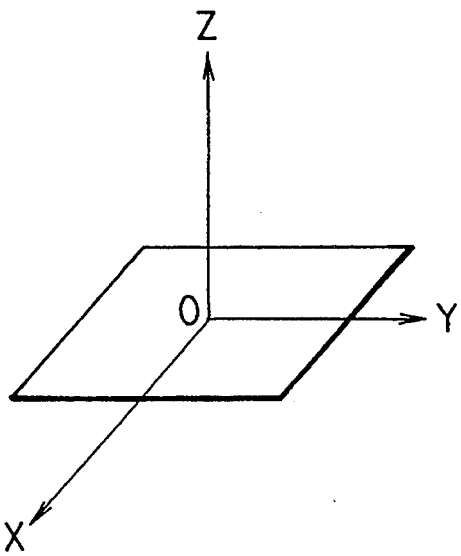
FIGS. 1A and 1B are diagrams showing the relationship between the surface structure of the highly oriented diamond film and Euler angles of a diamond film FET according to the invention.
Figure 1B:
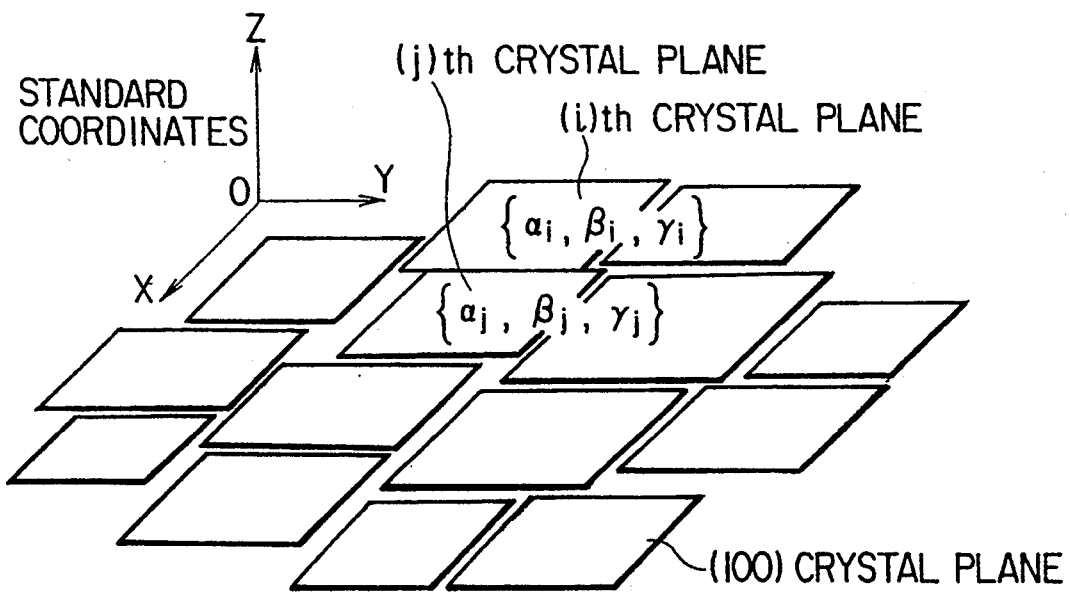
Figure 2A:
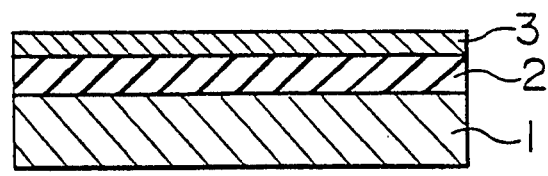
FIGS. 2A to 2D show the manufacturing process of a diamond film FET according to an embodiment of the present invention.

An one inch silicon wafer 1 of (100) cut (n-type, specific resistance: $1000\Omega.cm$ or more) was used as a substrate to deposit a highly oriented diamond film thereon as shown in FIG. 2A. The substrate was placed in a chamber for microwave plasma CVD and treated for 15 minutes under the following conditions: the source gas was 2.5% methane and 97.5% hydrogen, the gas pressure was 25 Torr, the gas flow rate was 300 ml/min, and the substrate temperature was 750° C. The power source of about 1100 W was used to generate microwave radiation, but the power was slightly adjusted so as to maintain the constant substrate temperature at 750° C. At the same time, a negative bias was applied to the substrate. The negative biasing current was 12 $mA/cm^2$.

(Step 2)

Subsequently, the diamond film deposition was continued for 30 hours under the following conditions: the source gas was 0.5% methane, 99.4% hydrogen and 0.1% oxygen, the gas pressure was 30 Torr, the gas flow rate was 300 ml/min, and the substrate temperature was 800° C. As a result, a highly-oriented diamond film 2 of about 8 $\mu m$ thickness was obtained, as shown in FIG. 2A.

An observation by electron microscope indicated that 88% of the film surface was covered by (100) crystal planes. From photographs of the film cross section, the maximum deviation of the crystal plane positions was found to be 0.2 $\mu m$ or less.

Two electron micrographs of the film surface were taken at angles $+10°$ and $-10°$ from the film surface normal and the inclinations of (100) crystal planes were determined. If was found that the differences in Euler angles between adjacent crystal planes satisfied all conditions of $|\Delta\alpha|\leq 5°$, $|\Delta\beta|\leq 5°$ and $|\Delta\gamma|\leq 5°$, and $(\Delta\alpha)^2+(\Delta\beta)^2+(\Delta\gamma)^2=35$.

(Step 3)

Similar experiments were repeated by changing the growth conditions of Step 1 according to Table 1. Sample in Table 1 was the same as the one described in Step 1.

TABLE 1

| Sample No. | Concentration of methane (%) | Concentration of hydrogen (%) | Temperature of substrate (°C.) |
|---|---|---|---|
| 1 | 2.5 | 97.5 | 750 |
| 2 | 3.0 | 97.0 | 800 |
| 3 | 3.5 | 96.5 | 830 |
| 4 | 4.0 | 96.0 | 850 |

In Sample 2, 82% of the film surface was covered by (100) crystal planes. The differences of the inclinations between adjacent crystals planes satisfy the relationship of $|\Delta\alpha|\leq 5°$, $|\Delta\beta|\leq 5°$ and $|\Delta\gamma|\leq 5°$. The value of $(\Delta\alpha)^2+(\Delta\beta)^2+(\Delta\gamma)^2$ for Sample 2 was 70.

On the other hand, in Samples 3 and 4, 77% and 70% respectively of the film surfaces were covered by (100) crystal planes and at least one of the differences of the inclinations between adjacent crystal planes fell in the range of $|\Delta\alpha|>5°$, $|\Delta\beta|>5°$ or $|\Delta\gamma|>5°$. The values of $(\Delta\alpha)^2+(\Delta\beta)^2+(\Delta\gamma)^2$ for Samples 3 and 4 were 85 and 105, respectively.

(Step 4)

FETs were fabricated using highly-oriented insulating diamond films of Samples 1 to 4 as the substrates. The same process was used for all FET fabrications.

As shown in FIG. 2A, a 0.4 μm thick silicon oxide film, not shown, was selectively formed by the sputtering method as a mask on the insulating diamond film 2 for selective deposition of the boron-doped P-type diamond film 3 serving as the semiconducting layer and having a thickness of 0.1 μm. The growth conditions were as follows: the source gas was 0.5% methane, 99.5% hydrogen and 0.1 ppm diborane, the gas pressure was 35 Torr, and the substrate temperature was 800° C.

(Step 5)

Figure 2B:
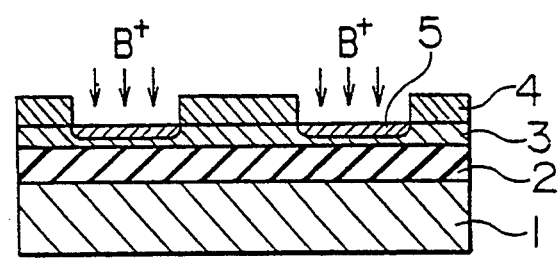

As shown in FIG. 2B, a metal mask 4 was selectively deposited on the P-type diamond film 3, and boron ions were implanted onto the region where the source and drain electrodes were to be formed. Thus, a heavily boron-doped semiconducting diamond regions 5 were selectively formed. The conditions for the ion implantation were as follows: the acceleration voltage was 60 KeV, and the ion dosage was $3\times 10^{16}$ cm$^{-2}$.

Subsequently, after the metal mask 4 was removed, the samples were annealed at 1000° C. in vacuum for 60 minutes in order to activate implanted boron atoms. Then, the samples were cleaned with chromic acid, aqua regia and RCA in order to remove the graphite layer produced on the diamond film surface during the ion implantation and the annealing process. The term "RCA" refers to the RCA cleaning process as described by W. Kern and D. A. Puotinen, in *Cleaning Solutions Based on Hydrogen for Use in Silicon Semiconductor Technology*, RCA Review, Vol. 31, No. 2, pp. 187–206 (June 1970).

(Step 6)

Figure 2C:
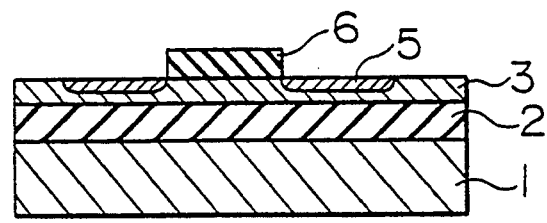

As shown in FIG. 2C, a 0.5 μm thick insulating diamond film 6 was deposited in the gate region on the P-type semiconducting channel layer 3 using a mask of silicon oxide film. After the silicon oxide film was removed, the samples were subjected an annealing treatment at 850° C. in vacuum for 30 minutes in order to stabilize the electrical characteristics of the insulating diamond layer 6. In alternate embodiments the insulating layer may be a non-diamond material selected from the group consisting of silicon oxide, silicon nitride, aluminum oxide, aluminum nitride and zirconium oxide. Subsequently, the samples were cleaned again with chromic acid, aqua regia and RCA.

(Step 7)

Figure 2D:
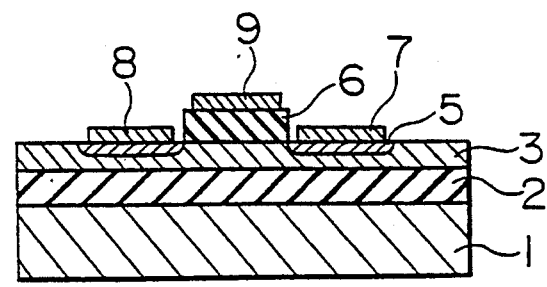

Finally, as shown in FIG. 2D, ohmic electrodes comprising of Au/Ti bilayer were formed by a sputtering method for the source and drain electrodes 7 and 8, respectively. An aluminum electrode 9 was formed by an electron beam deposition method for the gate electrode. Thus, ten diamond film FETs were fabricated at one time on the silicon wafer.

Figure 3:
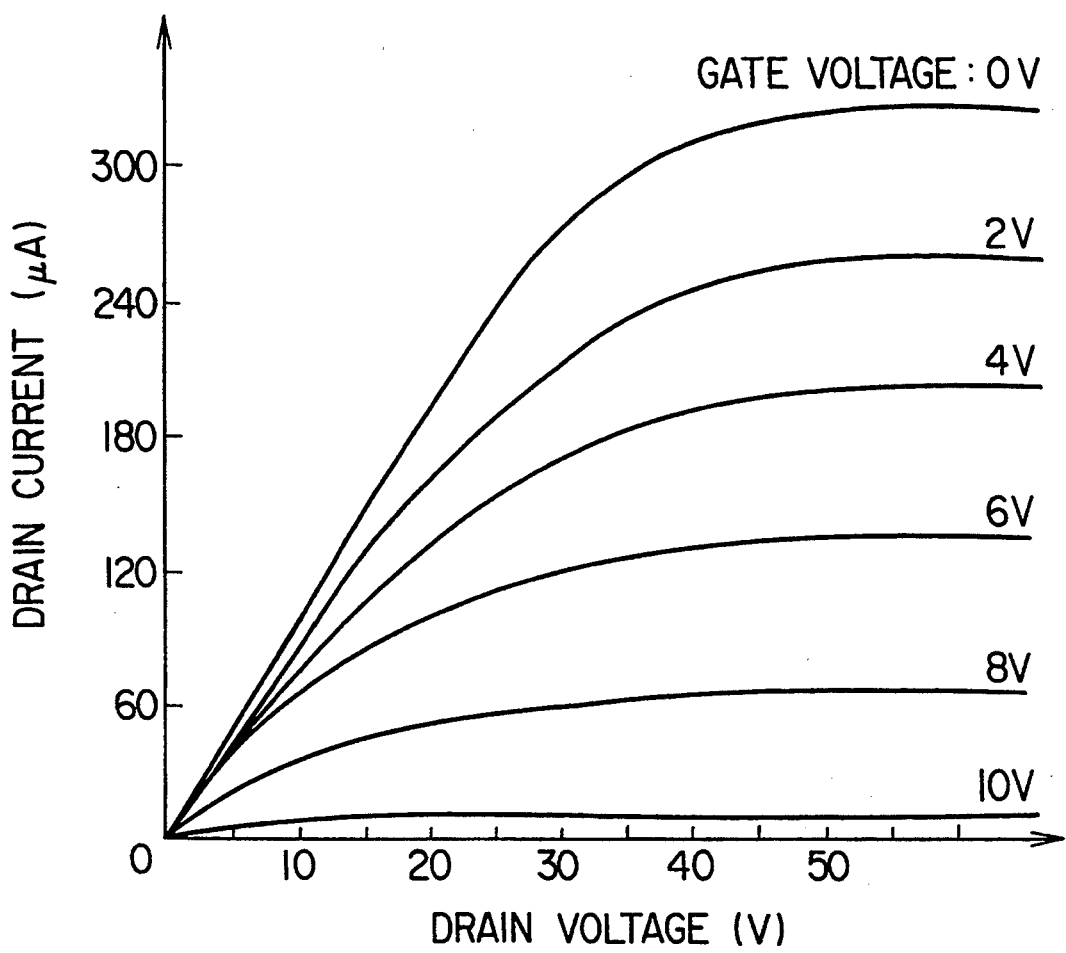
FIG. 3 is a graph showing the electrical characteristics of the diamond film FET according to the embodiment of the present invention.
Figure 4:
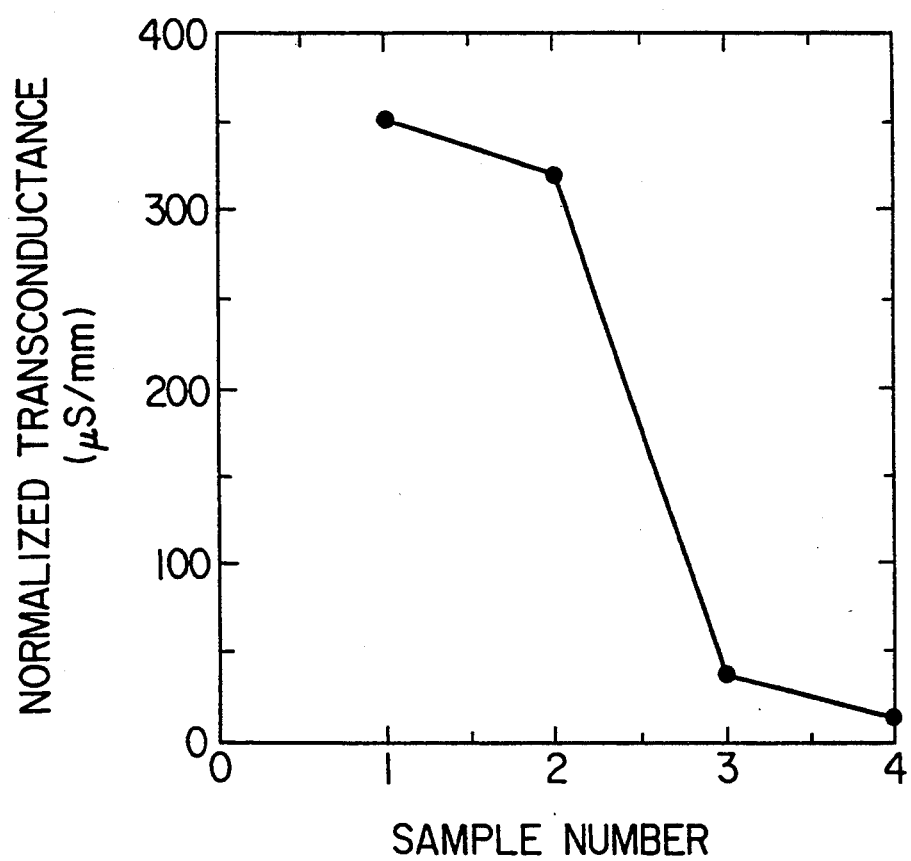
FIG. 4 is a graph showing the transconductances of the diamond film FETs prepared under different conditions.

The FET characteristics of Sample 1 are shown in FIG. 3. The normalized transconductance of the FET was 350 μS/mm, in which the gate width was 100 μm. The normalized transconductances of the FET samples are shown in FIG. 4. It is clearly seen that the highly-oriented diamond film according to the invention must be used to fabricate diamond film FETs with high transconductances. In other words, the semiconducting layer 3 is a highly oriented diamond film grown by CVD wherein at least 80% of the surface area consists of (100) or (111) crystal planes, and the differences $\{\Delta\alpha, \Delta\beta, \Delta\gamma\}$ of Euler angles between adjacent crystal planes simultaneously satisfies $|\Delta\alpha|\leq 5°$, $|\Delta\beta|\leq 5°$ and $|\Delta\gamma|\leq 5°$.

Figure 2E:
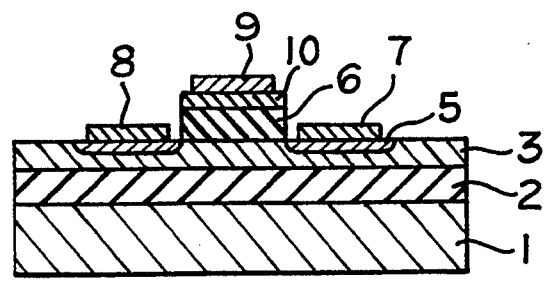
FIG. 2E is a diagram illustrating another embodiment of the FET according to the invention.

As shown in FIG. 2E, an embodiment of the FET may include a double layer as illustrated. The double layer includes an insulating non-diamond layer 10 and an insulating diamond layer 6.

What is claimed is:

1. A diamond film field-effect transistor comprising;
   a gate electrode formed on a semiconducting diamond layer;
   a source region and a drain region formed on said semiconducting diamond layer; and
   said semiconducting diamond layer having a channel region adjacent said gate electrode and extending between said source and drain regions, said semiconducting diamond layer comprising a highly-oriented diamond film in which at least 80% of the surface area of said diamond film consists of a plurality of (100) crystal planes having Euler angles differences therebetween which are $\{\Delta\alpha, \Delta\beta, \Delta\gamma\}$, said crystal planes being oriented relative to one another so that the differences $\{\Delta\alpha, \Delta\beta, \Delta\gamma\}$ of respective Euler angles $\{\alpha, \beta, \gamma\}$, which represent the orientations of the (100) crystal planes simultaneously satisfy $0°<|\Delta\alpha|\leq 5°$, $0°<|\Delta\beta|\leq 5°$ and $0°<|\Delta\gamma|\leq 5°$ between adjacent crystal planes.

2. A diamond film field-effect transistor according to claim 1 further comprising an insulating diamond basal layer provided under said semiconducting diamond layer formed of said highly-oriented diamond film.

3. A diamond film field-effect transistor according to claim 1 further comprising a diamond insulating layer formed between the semiconducting diamond layer and the gate electrode.

4. A diamond film field-effect transistor according to claim 1 further comprising a non-diamond insulating layer formed between the semiconducting diamond layer and the gate electrode.

5. A diamond film field-effect transistor according to claim 4 wherein said non-diamond insulating layer is made of a material selected from the group consisting of silicon oxide, silicon nitride, aluminum oxide, aluminum nitride and zirconium oxide.

6. A diamond film field-effect transistor according to claim 1 further comprising a double layer having a non-diamond insulating layer and a diamond insulating layer, the double layer being provided between the semiconducting diamond layer and the gate electrode.

7. A diamond film field-effect transistor according to claim 6 wherein said non-diamond insulating layer is made of a material selected from the group consisting of silicon oxide, silicon nitride, aluminum oxide, aluminum nitride and zirconium oxide.

8. A diamond film field-effect transistor according to claim 1 further comprising respective source and drain electrodes on said source and drain regions, and wherein said source and drain regions each comprise a heavily doped semiconducting diamond layer with a lower resistance than that of the semiconducting diamond layer formed of said highly-oriented diamond film.

9. A diamond film field-effect transistor comprising;
a gate electrode formed on a semiconducting diamond layer;
a source region and a drain region formed on said semiconducting diamond layer; and
said semiconducting diamond layer having a channel region adjacent said gate electrode and extending between said source and drain regions, said semiconducting diamond layer comprising a highly-oriented diamond film in which at least 80% of the surface area of said diamond film consists of a plurality of (111) crystal planes having Euler angles differences therebetween which are $\{\Delta\alpha, \Delta\beta, \Delta\gamma\}$, said crystal planes being oriented relative to one another so that the differences $\{\Delta\alpha, \Delta\beta, \Delta\gamma\}$ of respective Euler angles $\{\alpha, \beta, \gamma\}$, which represent the orientations of the (111) crystal planes simultaneously satisfy $0° < |\Delta\alpha| \leq 5°$, $0° < |\Delta\beta| \leq 5°$ and $0° \not> |\Delta\gamma| \leq 5°$ between adjacent crystal planes.

10. A diamond film field-effect transistor according to claim 9 further comprising an insulating diamond basal layer provided under said semiconducting diamond layer formed of said highly-oriented diamond film.

11. A diamond film field-effect transistor according to claim 9 further comprising a diamond insulating layer formed between the semiconducting diamond layer and the gate electrode.

12. A diamond film filed-effect transistor according to claim 9 further comprising a non-diamond insulating layer formed between the semiconducting diamond layer and the gate electrode.

13. A diamond film field-effect transistor according to claim 12 wherein said non-diamond insulating layer is made of a material selected from the group consisting of silicon oxide, silicon nitride, aluminum oxide, aluminum nitride and zirconium oxide.

14. A diamond film field-effect transistor according to claim 9 further comprising a double layer having a non-diamond insulating layer and a diamond insulating layer, the double layer being provided between the semiconducting diamond layer and the gate electrode.

15. A diamond film field-effect transistor according to claim 14 wherein said non-diamond insulating layer is made of a material selected from the group consisting of silicon oxide, silicon nitride, aluminum oxide, aluminum nitride and zirconium oxide.

16. A diamond film field-effect transistor according to claim 9 further comprising respective source and drain electrodes on said source and drain regions, and wherein said source and drain regions each comprise a heavily doped semiconducting diamond layer with a lower resistance than that of the semiconducting diamond layer formed of said highly-oriented diamond film.

* * * * *

UNITED STATES PATENT AND TRADEMARK OFFICE
CERTIFICATE OF CORRECTION

PATENT NO. : 5,371,383
DATED : December 6, 1994
INVENTOR(S) : Miyata et al.

It is certified that error appears in the above-identified patent and that said Letters Patent is hereby corrected as shown below:

Column 4, line 57, after "ple" insert –1–;
column 5, line 18, delete "As shown in FIG. 2A, a" and insert –A–;

Column 7, Claim 9, line 30, "Δ<" to --Δα-- and line 31, "𝑓" to --<-- therefor –

Signed and Sealed this

Twenty-ninth Day of October 1996

Attest:

BRUCE LEHMAN

Attesting Officer

Commissioner of Patents and Trademarks